(12) United States Patent
Yokosuka et al.

(10) Patent No.: US 9,640,366 B2
(45) Date of Patent: May 2, 2017

(54) ELECTRON BEAM IRRADIATION METHOD AND SCANNING ELECTRON MICROSCOPE

(75) Inventors: Toshiyuki Yokosuka, Hitachinaka (JP); Minoru Yamazaki, Ushiku (JP); Hideyuki Kazumi, Hitachinaka (JP); Kazutami Tago, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 92 days.

(21) Appl. No.: 13/580,288

(22) PCT Filed: Feb. 9, 2011

(86) PCT No.: PCT/JP2011/000706
§ 371 (c)(1),
(2), (4) Date: Aug. 21, 2012

(87) PCT Pub. No.: WO2011/121875
PCT Pub. Date: Oct. 6, 2011

(65) Prior Publication Data
US 2013/0009057 A1    Jan. 10, 2013

(30) Foreign Application Priority Data

Mar. 30, 2010  (JP) ................................. 2010-076567

(51) Int. Cl.
*H01J 37/28*  (2006.01)
*H01J 37/02*  (2006.01)
*H01J 37/26*  (2006.01)

(52) U.S. Cl.
CPC ............ *H01J 37/28* (2013.01); *H01J 37/026* (2013.01); *H01J 37/266* (2013.01);
(Continued)

(58) Field of Classification Search
CPC ............. H01J 37/28; H01J 2237/31769; H01J 2237/0048; G01N 2223/351
(Continued)

(56) References Cited

U.S. PATENT DOCUMENTS 5,412,209 A    5/1995  Otaka et al.
5,986,263 A    11/1999 Hiroi et al.
(Continued)

FOREIGN PATENT DOCUMENTS

JP    5-151927 A    6/1993
JP    9-320505 A    12/1997
(Continued)

OTHER PUBLICATIONS

International Search Report with English translation dated Mar. 15, 2011 (four (4) pages).

*Primary Examiner* — Brooke Purinton
(74) *Attorney, Agent, or Firm* — Crowell & Moring LLP

(57) ABSTRACT

The present invention has for its object to provide a charged particle beam irradiation method and a charged particle beam apparatus which can suppress unevenness of electrification even when a plurality of different kinds of materials are contained in a pre-dosing area or degrees of density of patterns inside the pre-dosing area differs with positions. To accomplish the above object, a charged particle beam irradiation method and a charged particle beam apparatus are provided according to which the pre-dosing area is divided into a plurality of divisional areas and electrifications are deposited to the plural divisional areas by using a beam under different beam irradiation conditions. With the above construction, the electrifications can be deposited to the pre-dosing area on the basis of such an irradiation condition that the differences in electrification at individual positions inside the pre-dosing area can be suppressed and
(Continued)

consequently, an influence an electric field has upon the charged particle beam and electrons given off from the sample can be suppressed.

10 Claims, 13 Drawing Sheets

(52) U.S. Cl.
CPC ..... *H01J 37/268* (2013.01); *H01J 2237/0048* (2013.01); *H01J 2237/24564* (2013.01); *H01J 2237/2594* (2013.01)

(58) Field of Classification Search
USPC .......................................... 250/306, 307, 310
See application file for complete search history.

(56) References Cited

U.S. PATENT DOCUMENTS

| 6,066,849 | A | 5/2000 | Masnaghetti et al. | |
| 6,232,787 | B1* | 5/2001 | Lo et al. | 324/754.22 |
| 6,344,750 | B1 | 2/2002 | Lo et al. | |
| 2003/0146397 | A1* | 8/2003 | Yoda et al. | 250/492.22 |
| 2004/0227077 | A1* | 11/2004 | Takagi et al. | 250/310 |
| 2007/0024528 | A1 | 2/2007 | Kobaru et al. | |
| 2008/0201091 | A1* | 8/2008 | Ezumi et al. | 702/64 |
| 2008/0251718 | A1* | 10/2008 | Kaga | G01N 23/203 250/310 |
| 2009/0039264 | A1 | 2/2009 | Ikegami et al. | |
| 2009/0084954 | A1 | 4/2009 | Ezumi et al. | |
| 2009/0166557 | A1* | 7/2009 | Makino et al. | 250/442.11 |
| 2010/0258722 | A1* | 10/2010 | Fang | H01J 37/026 250/310 |

FOREIGN PATENT DOCUMENTS

| JP | 2000-208085 A | 7/2000 |
| JP | 2002-524827 A | 8/2002 |
| JP | 2007-59370 A | 3/2007 |
| JP | 2009-43936 A | 2/2009 |
| JP | 2009-99540 A | 5/2009 |

* cited by examiner

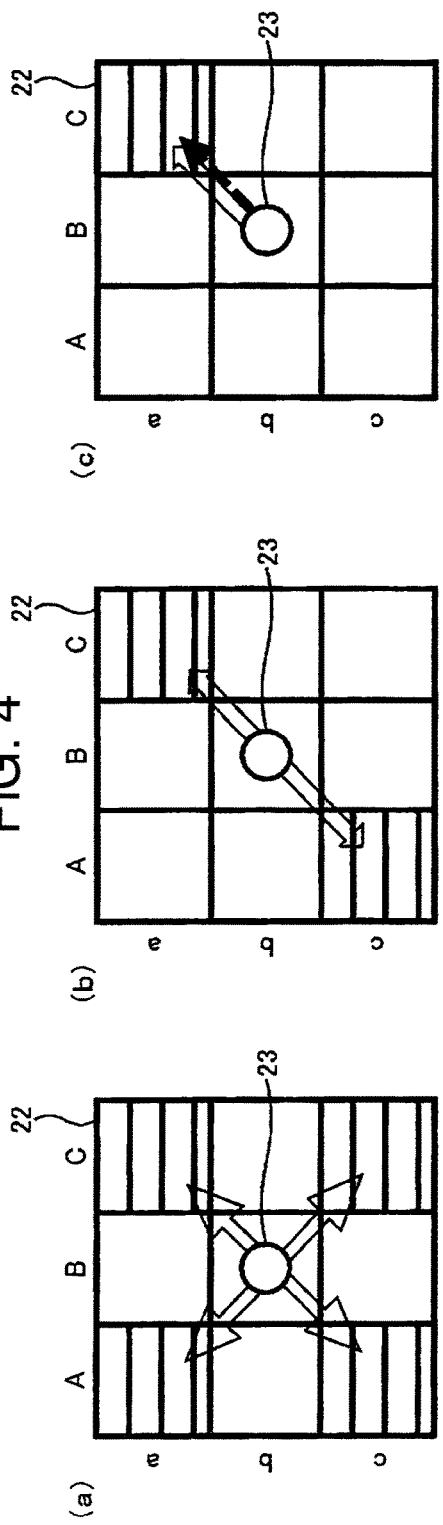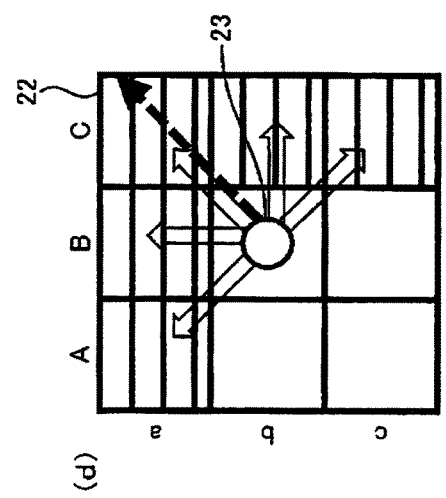

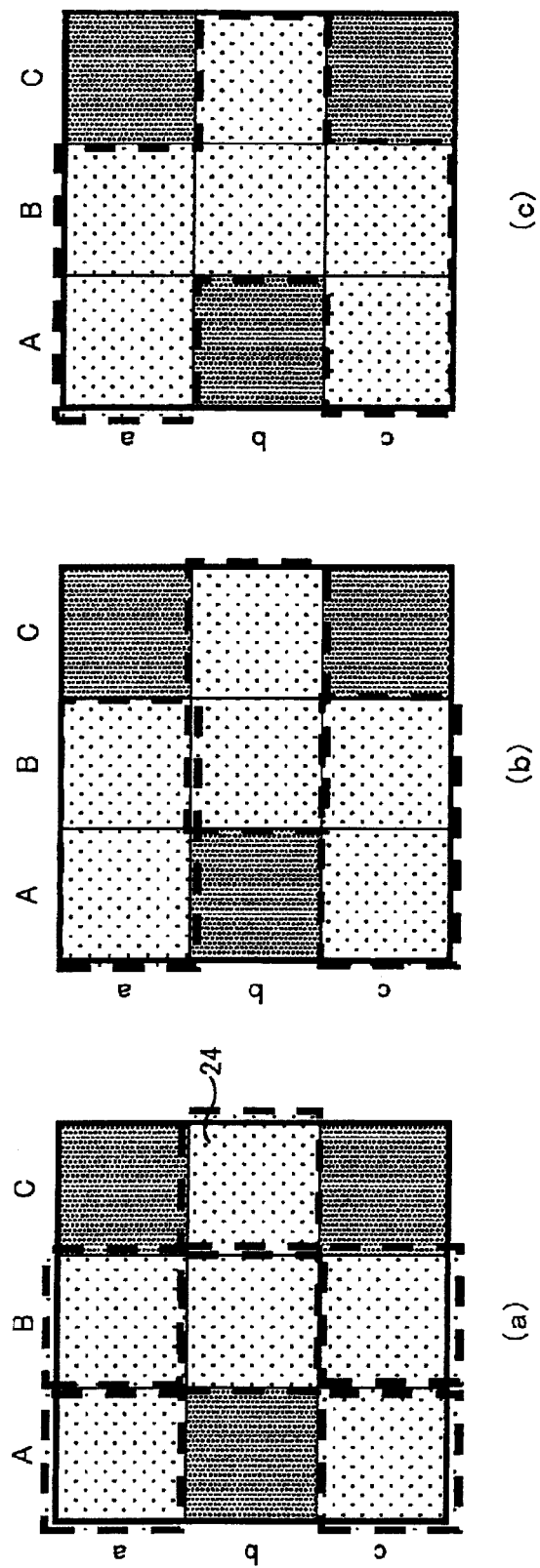

ELECTRON BEAM IRRADIATION METHOD AND SCANNING ELECTRON MICROSCOPE

TECHNICAL FIELD

The present invention relates to an electron microscope and an electron beam irradiation method as well and a computer program therefor, and more particularly, to an electron beam irradiation method, an electron microscope and a computer program which are used when an electrification is deposited on a sample in advance by beam irradiation and a beam is irradiated onto the electrification deposited area.

BACKGROUND ART

In a scanning electron microscope (SEM) representing one type of a charged particle beam apparatus, an observation method has been known which makes use of electrification generated by irradiation of an electron beam. Available as an observation objective using the observation method is, for example, a contact hole of a semiconductor device. With the semiconductor device rendered corpuscular, the aspect ratio (ratio of depth to diameter) of the hole has been tending to increase. When observation of a hole having an aspect ratio of, for example, 20 is considered, the possibility that electrons given off from the bottom of hole will impinge upon the side wall of the hole increases and detection of the electrons fails, making it sometimes difficult to observe the shape of hole bottom.

The observation method making use of the electrification is used exemplarily to pull up electrons given off from the bottom of hole. In order to pull up secondary electrons generated at the hole bottom, a pull-up electric field needs to be formed by applying a positive electrification to the outer surface (entrance) of the hole. For this purpose, an electron beam irradiation is carried out through pre-dosing (preliminary irradiation) apart from observation by using a beam being at a low magnification or having a larger efficiency of discharging secondary electrons (electrons discharged from a sample/electrons incident to the sample) as compared to a beam for observation, thus applying the positive electrification.

When conducting ordinary observation after the positive electrification has been applied, secondary electrons generated at the hole bottom are pulled up to the outside of the hole with the help of the pull-up electric field formed by the positive electrification at the surface. By detecting the electrons, the shape of the hole bottom can be observed. In Patent Literatures 1 to 4, an observation method is explained in which after electrification has been deposited on a sample by preliminary irradiation based on electron beam irradiation, a beam dedicated to observation is irradiated.

CITATION LIST

Patent Literatures

Patent Literature 1: JP-A-2000-208085 (corresponding to U.S. Pat. No. 6,344,750)
Patent Literature 2: JP-A-2002-524827 (corresponding to U.S. Pat. No. 6,570,154)
Patent Literature 3: JP-A-05-151927 (corresponding to U.S. Pat. No. 5,412,209)
Patent Literature 4: JP-A-2009-99540 (corresponding to US Patent Public Disclosure 2009/0084954)

SUMMARY OF INVENTION

Technical Problem

The possibility that with a semiconductor device integrated, corpuscle and complexity of a pattern has been accelerated and, electrification within a preliminary irradiation area will therefore become uneven in the plane was clarified through studies by the present inventors. Namely, when the preliminary electrification irradiation is carried out under the uniform condition of beam irradiation over the whole of preliminary electrification area as explained in Patent Literatures 1 through 3, there is a possibility that an electrification different from another will occur partly. When the preliminary electrification becomes non-uniform within the irradiation area, electrons given off from the bottom of hole will possibly be deflected by the uneven electrification. Also, a beam for observation will possibly be deflected.

Further, while performing the preliminary irradiation in a plurality of steps by changing the magnification as explained in Patent Literature 4, the electrification uniformity can be realized to some extent through a manner of flattening the electric potential distribution around the hole but, for example, in the presence of a plurality of members made of different materials contained within the preliminary irradiation area or due to different degrees of denseness of patterns in plane, an electrification bias will still take place which cannot be eliminated sufficiently.

A charged particle beam irradiation method and a charged particle beam apparatus will be described hereinafter which have the aim of suppressing the non-uniformity of electrification even for a sample in which a plurality of members of different materials are contained inside a preliminary irradiation area or the degree of denseness of patterns within the preliminary irradiation area differs position by position.

Solution to Problem

As an embodiment for attaining the above object, a charged particle beam irradiation method and a charged particle beam apparatus will be proposed in which a preliminary irradiation area or pre-dosing area is divided into a plurality of divisional areas and electrification is deposited to the plurality of divisional areas by using a beam under different beam irradiation conditions.

Advantageous Effects of Invention

Since, according to the above embodiment, electrification can be deposited to the pre-dosing area on the basis of such an irradiation condition that differences in electrification at individual positions inside the pre-dosing area can be suppressed, an influence the electric field has upon the charged particle beam and electrons given off from the sample can be suppressed.

BRIEF DESCRIPTION OF DRAWINGS

FIG. 4 is a diagram for explaining an example where a plurality of divisional areas undergoing different changes in electrification exist within the pre-dosing area.

FIG. 5 is a diagram for explaining an example of setting a pre-dosing area excluding an electrification changing divisional area.

DESCRIPTION OF EMBODIMENTS

Figure 1:
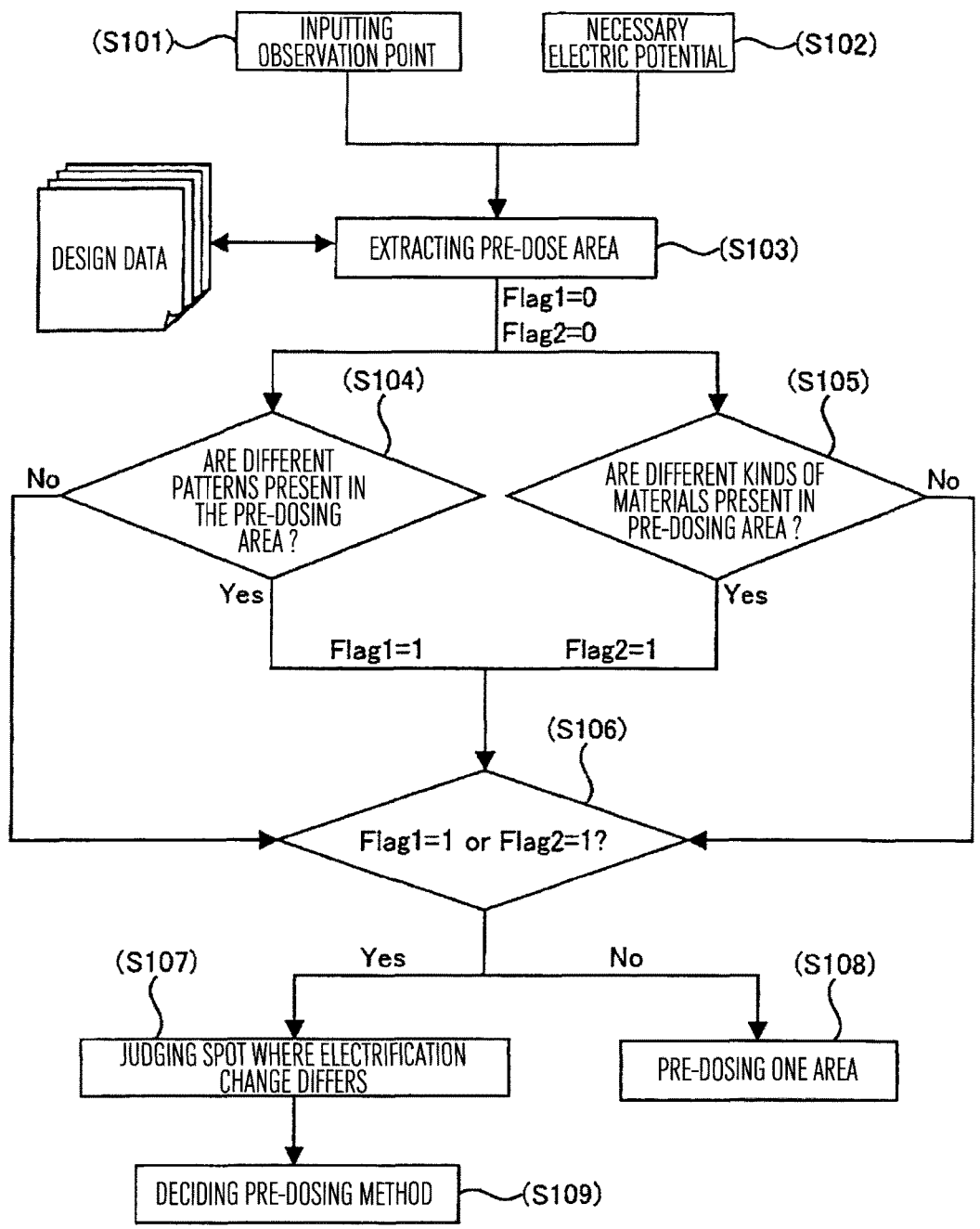
FIG. 1 is a flowchart for explaining processes of determining pre-dosing conditions on the basis of an input to an observation point and an input of electric potential of electrification deposited to a sample.

With a semiconductor device rendered corpuscular and highly integrated in recent years, a contact hole has been becoming finer and deeper. This type of contact hole is called HARC (High Aspect Ratio Contact) and has been becoming difficult to observe.

Known as a method for observation of the HARC is a preliminary electrification method for depositing positive electrification to a sample in advance. In the preliminary electrification method, a beam for depositing electrification is irradiated to deposit electrification before a beam for observation is irradiated so that the trajectory of electrons given off from the sample may be controlled, and the preliminary electrification method is also called a pre-dosing or pre-charging method. As the high aspect of a hole pattern prevails nowadays, however, the electrification electric potential necessary for observation shows a tendency to increase. In order for secondary electrons to be pulled up from a deeper hole bottom, a stronger pull-up electrical field needs to be set up and as a consequence, positive electrification electric potential to be applied to the surface must be increased.

Since the positive electrification electric potential is correlated negatively to the magnification of pre-dosing and in order for the electric potential to be raised, the magnification is required to be more lowered. This broadens the pre-dosing range and so, the influence a neighboring pattern has increases during formation of the surface electrification. For example, in case a pattern of a different material is contained within the pre-dosing range, the electrification time constant responsible for changing (relaxing) the set up positive electrification differs, giving rise to such a phenomenon that only part of electrification falls out or remains. Accordingly, as only the part of electrification changes or does not change, the electric field distribution formed immediately above the surface is caused to change, having an influence upon the trajectory of primary electrons.

A high magnification is used for observation and therefore, even a slight influence upon the trajectory appears as exaggeratedly on an image. In ordinary observation, an image is obtained by superposing a plurality of frames to improve the S/N and during superposition of frames, the electron beam is curved and an image having its contour blurred results.

In addition, when switchover is carried out between pre-dosing and observation each time that a single HARC is observed, time to execute the pre-dosing needs to differ from time to observe and there is a possibility that the throughput will be lowered.

The present inventors have noticed the fact that the electrification deposited by the preliminary irradiation formed around an area to be observed has an influence upon the primary electrons (electron beam), giving rise to the possibility that the observation position will be caused to displace, the trajectory of electrons given off from the hole bottom will be so deflected as to impinge upon the hole side wall, failing to be detected.

Depending on the surface shape of a sample to be observed, pre-dosing is carried out to prepare for SEM measurement so that the sample surface may be electrified positively in advance. The positive electrification formed through the pre-dosing will be changed (relaxed) depending on patterns and materials contained in the area pre-dosed. The speed of relaxation is inherent to the material and also, differs depending on the shape of surface. In case the relaxation speed is high, the positive electrification decreases during observation. The speed at which the positive electrification decreases is not constant within the pre-dosing area but differs with patterns and materials contained in the area and hence, the primary electron is curved in accordance with an electric field formed by non-uniform decrease of electrification. When the above phenomenon takes place during observation, an objective being observed moves (drifts) in a fixed direction. When capturing images, the above causes an image to have its pattern contour blurred.

Accordingly, in the present embodiment, by making reference to the accompanying drawings, a method and an apparatus will be described which can suppress drift and the like of an observation objective image by suppressing the influence a change in electrification has during observation.

Especially, in the present embodiment, an electrification forming method will be set which combines a plurality of pre-dosing operations subject to different conditions of making uniform the electrification distribution by taking patterns contained in a pre-dosing area into account. Further, by having a plurality of conditions of scanning within one frame, observation is carried out during the pre-dose for forming positive electrification.

By executing the pre-dosing so as to make the electrification distribution uniform by taking patterns contained within the pre-dosing area into account as described above, the influence the electrification change has during observation can be suppressed to suppress the influence (drift) upon the image. Further, by making uniform the electrification distribution on the surface, a plurality of points can be observed by using the image shift through one pre-dosing and improvements in throughput can be expected.

A method, apparatus, system and computer program (or a memory medium for storing the computer program or a transmission medium for transmitting the program) which can enable proper pre-dosing conditions to be set will now be described by making reference to the accompanying drawings. More specifically, an apparatus including a critical dimension-scanning electron microscope (CD-SEM) representing a kind of critical dimensioning apparatus, a system and a computer program which can be materialized with the apparatus and system will be described.

Figure 9:
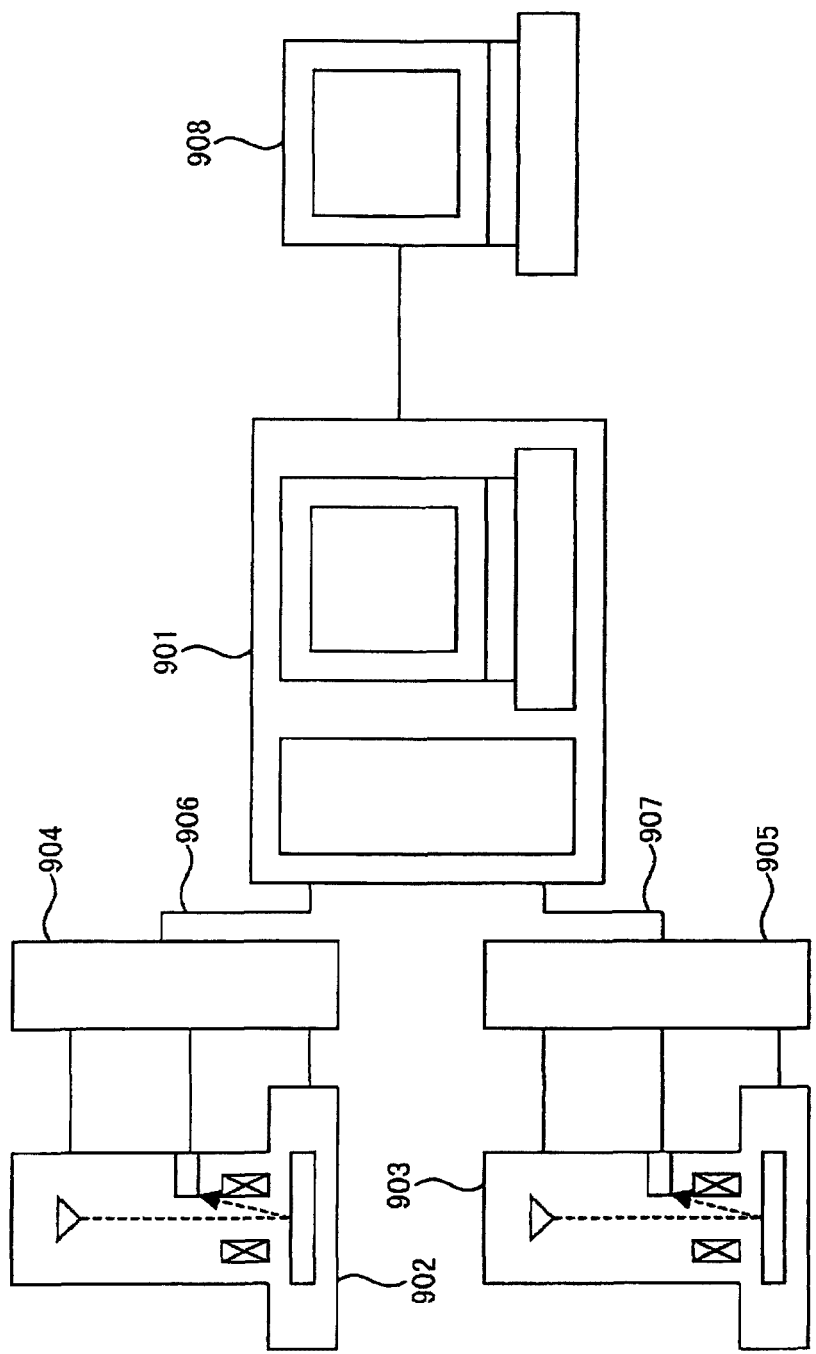
FIG. 9 is a diagram for explaining an example of a measurement and inspection system including scanning electron microscopes.

Exemplified in FIG. 9 is a system in which a plurality of SEM's are connected to be centered on a data management unit 901. Especially, in the case of the present embodiment, an SEM 902 is adapted to mainly measure and inspect patterns of a photomask and a reticle which are used for semiconductor photo-exposure process and an SEM 903 is adapted to mainly measure and inspect a pattern transferred onto a semiconductor wafer by light exposure using the photomask. The SEM's 902 and 903 are not different largely from each other in the essential construction of electron microscope but they are so constructed as to correspond to differences in sizes of semiconductor wafer and of photomask and differences in electrification proof properties, respectively.

The SEM's 902 and 903 are connected with control units 904 and 905, respectively, so as to undergo control necessary for SEM. In each of the SEM's, an electron beam emitted from an electron source is focused by means of a plurality of stages of lenses and a focused electron beam is scanned on a sample one-dimensionally or two-dimensionally.

Secondary electrons (SE's) given off from the sample or backscattered electrons (BSE's) under scanning of the electron beam are detected by a detector and detected signals are stored in a memory medium such as a frame memory in synchronism with scan by a scanning deflector. The scan by the scanning deflector can be conducted in an arbitrary size, at an arbitrary position and in an arbitrary direction, thus making it possible to perform scan for forming images to be described later and selective scan to edge portions.

The control and the like as above are executed by means of the control unit 904 or 905 of each SEM and images and signals obtained as a result of the scan of an electron beam are sent to the data management unit 901 through the medium of a communication line 906 or 907. In the present example, the control unit for controlling the SEM is described as being separate from the data management unit adapted for measurement on the basis of the signals obtained by means of the SEM but this is not limitative and the data management unit may perform apparatus control and measurement process collectively or each control unit may perform SEM control together with measurement process. In an alternative construction, beam irradiation conditions and the like may be stored in an external memory medium and the control unit may be possible to access the memory medium.

Further, the data management unit or a computer such as the control unit stores a program for executing the measurement process and carries out measurement or operation in accordance with the program. The program is stored in a recording medium readable by the computer. In addition, a design data management unit is stored with design data of a photomask used for semiconductor production process (hereinafter simply referred to as a mask) and of wafer. The design data is expressed in, for example, GDS format or OASIS format and stored in a predetermined format. It makes no matter what kind the design data has, provided that the software adapted to display the design data can display the format formality to handle it as figure data. Alternatively, the design data may be stored in a memory medium installed separately from the data management unit.

Also connected to the data management unit 901 is a simulator 908. Structurally, the simulator 908 incorporates a program for preparing pattern layouts on the basis of the design data stored in the external memory medium or data management unit 901 and the conditions of semiconductor production process and besides, an arithmetic unit for execution of the program, and can transmit layout data following the simulation to the data management unit. While, in the present embodiment, the simulation is described as being done exemplarily in the simulator 908, this is not limitative and the simulation may be conducted by executing the program inside the data management unit 901, for instance.

Also, the data management unit 901 has the function to prepare, on the basis of the design data of semiconductor, a program (recipe) for controlling the operation of SEM and it operates also as a recipe setter. More specifically, the data management unit sets positions or the like necessary for the SEM to perform necessary processes such as for desired measurement points, auto-focus, auto-stigmatism and addressing points on the design data, data of pattern contour or design data applied with simulation and prepares, on the basis of the setting, a program for automatically controlling the sample stage, deflector and the like of the SEM. In other words, the data management unit 901 and control unit 905 function as a measurement condition setter.

Figure 10:
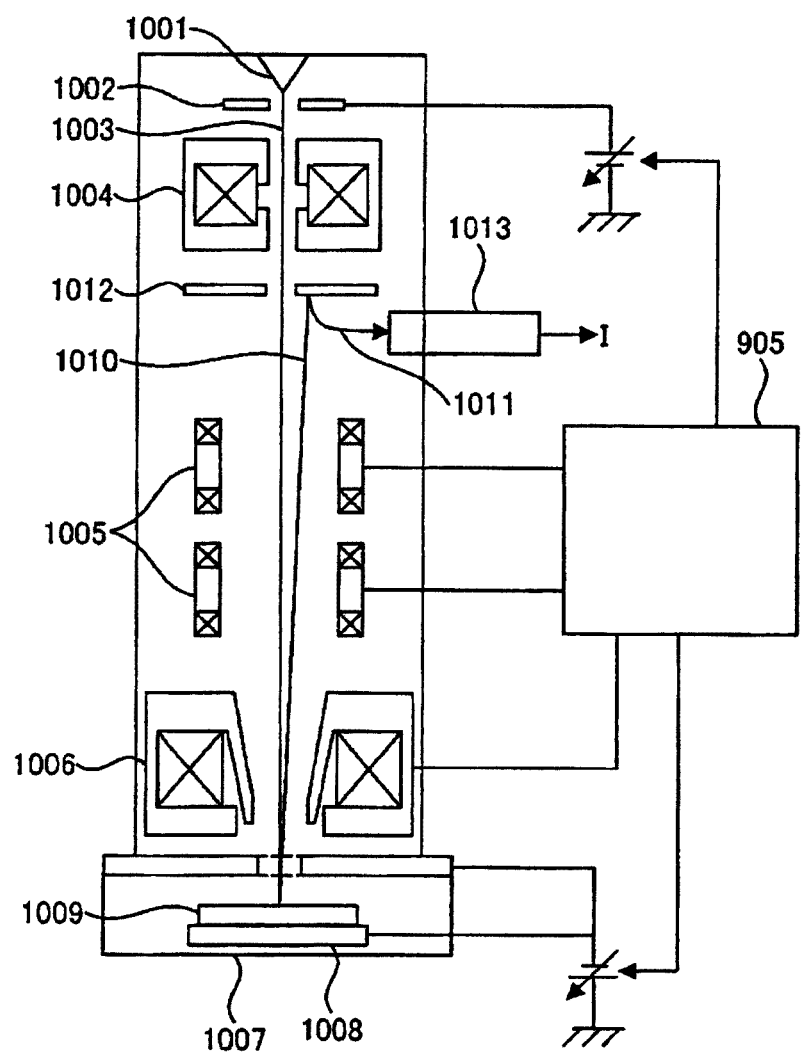
FIG. 10 is a schematic construction diagram of the scanning electron microscope.

FIG. 10 is a schematic construction diagram of the scanning electron microscope. An electron beam 1003 extracted from an electron source 1001 by means of an extraction electrode 1002 and accelerated by an acceleration electrode not shown is converged by means of a condenser lens 1004 representing a type of convergence lens and thereafter, scanned on a sample 1009 one-dimensionally or two-dimensionally by means of a scanning deflector 1005. The electron beam 1003 is decelerated by negative voltage applied to an electrode built in a sample stage 1008 and is focused by the lens action of an objective lens 1006 so as to be irradiated on the sample 1009. The sample 1009 is located in vacuum ambience inside a sample chamber 1007.

When the electron beam 1003 is irradiated on the sample 1009, such electrons 1010 as secondary electrons and backscattered electrons are given off from the irradiation spot. The given off electrons 1010 are accelerated toward the electron source by the acceleration action based on the negative voltage applied to the sample and they are caused to impinge upon a conversion electrode 1012, generating secondary electrons 1011. The secondary electrons 1011 discharged from the conversion electrode 1012 are captured by a detector 1013 and an output I of detector 1013 is changed by amounts of secondary electrons captured by the detector 1013. In accordance with the output I, the brightness of a display unit not shown changes. For example, when a two-dimensional image is to be formed, an image of scanning area is formed by synchronizing a deflection signal to the scanning deflector 1005 with the output I of detector 1013. The scanning electron microscope exemplified in FIG. 10 also includes a deflector (not shown) for moving the scanning area of electron beam. This deflector is used for forming images or the like of patterns of the same contour existing at different positions. The deflector is also called an image shift deflector which makes it possible to move the position of a field of view (FOV) without performing sample movement or the like by means of the sample stage. With a deflector in common to the image shift deflector and the scanning deflector used, a signal for image shift may be superposed on a signal for scanning and the resultant signal may be supplied to this type of deflector.

While, in the example of FIG. 10, a description is given by way of example of detection of electrons discharged from the sample after converting them once by means of the conversion electrode, this construction is in no way limitative and structurally, for example, the detection surface of an electron-multiplier tube or of a detector can be arranged on the trajectory of the accelerated electrons.

A control unit 905 controls individual constituents of scanning electron microscope and functions to form images on the basis of detected electrons and measure a pattern width of a pattern formed on the sample on the basis of the distribution of intensities of detected electrons, called a line profile.

The control unit 905 incorporates a memory medium for storing a recipe written with conditions of a first electron beam adapted to electrify an area used for pattern measurement or formation of an image for inspection and beam conditions of a second electron beam for image formation. The scanning electron microscope controls landing energy of the electron beam to the sample, beam current and/or magnification in accordance with the conditions stored in the memory medium. Any of these beam conditions are for controlling sample electrification, and the sample electrification and individual beam conditions (landing energy, beam current, magnification or a combination of two or more of these conditions) may be stored in a memory medium and these conditions may be read out and set on the basis of designation of pre-dosing conditions.

Figure 11:
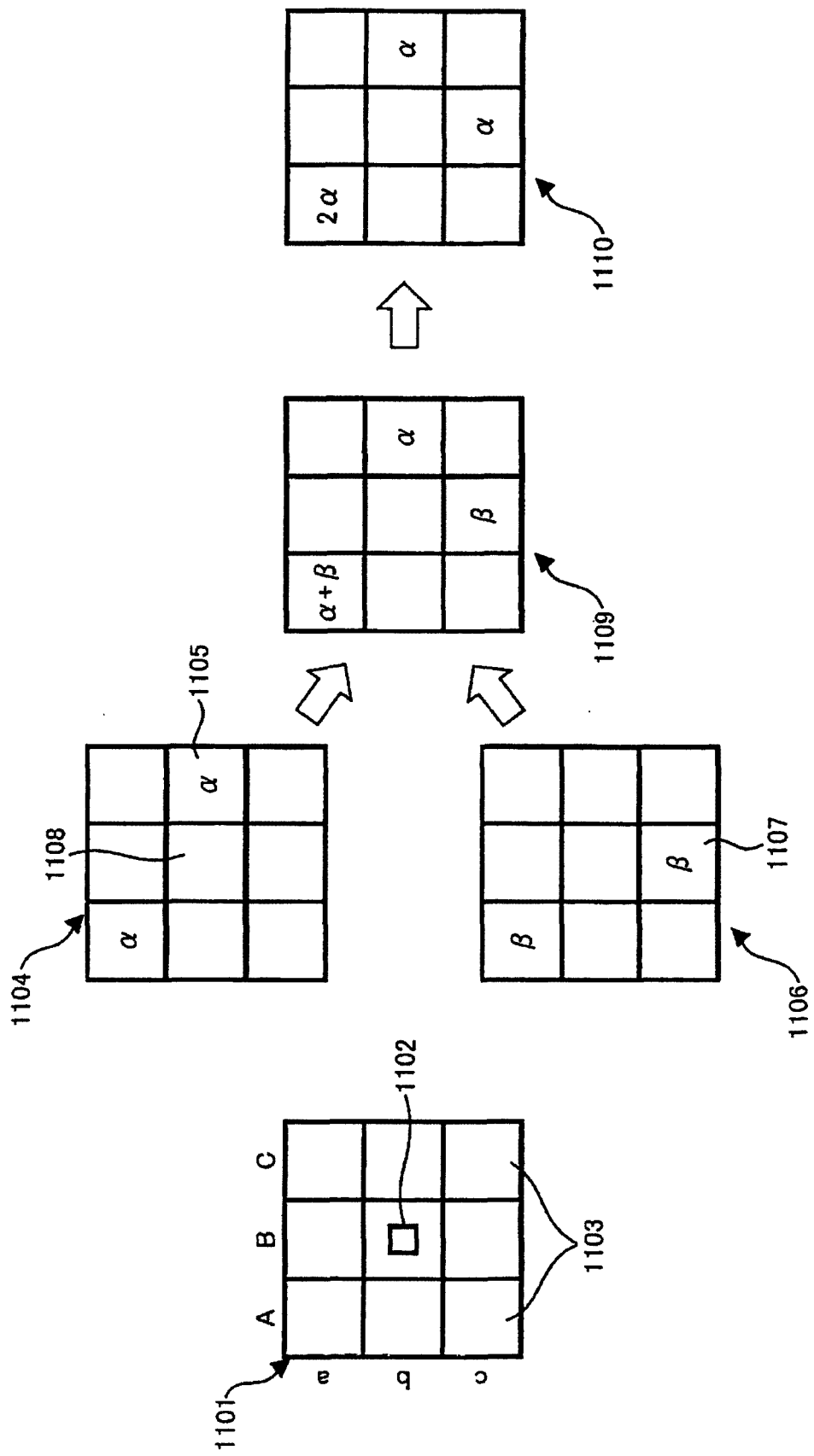
FIG. 11 is a diagram for explaining processes of determining pre-dosing conditions on the basis of setting of measurement points on design data.
Figure 12:
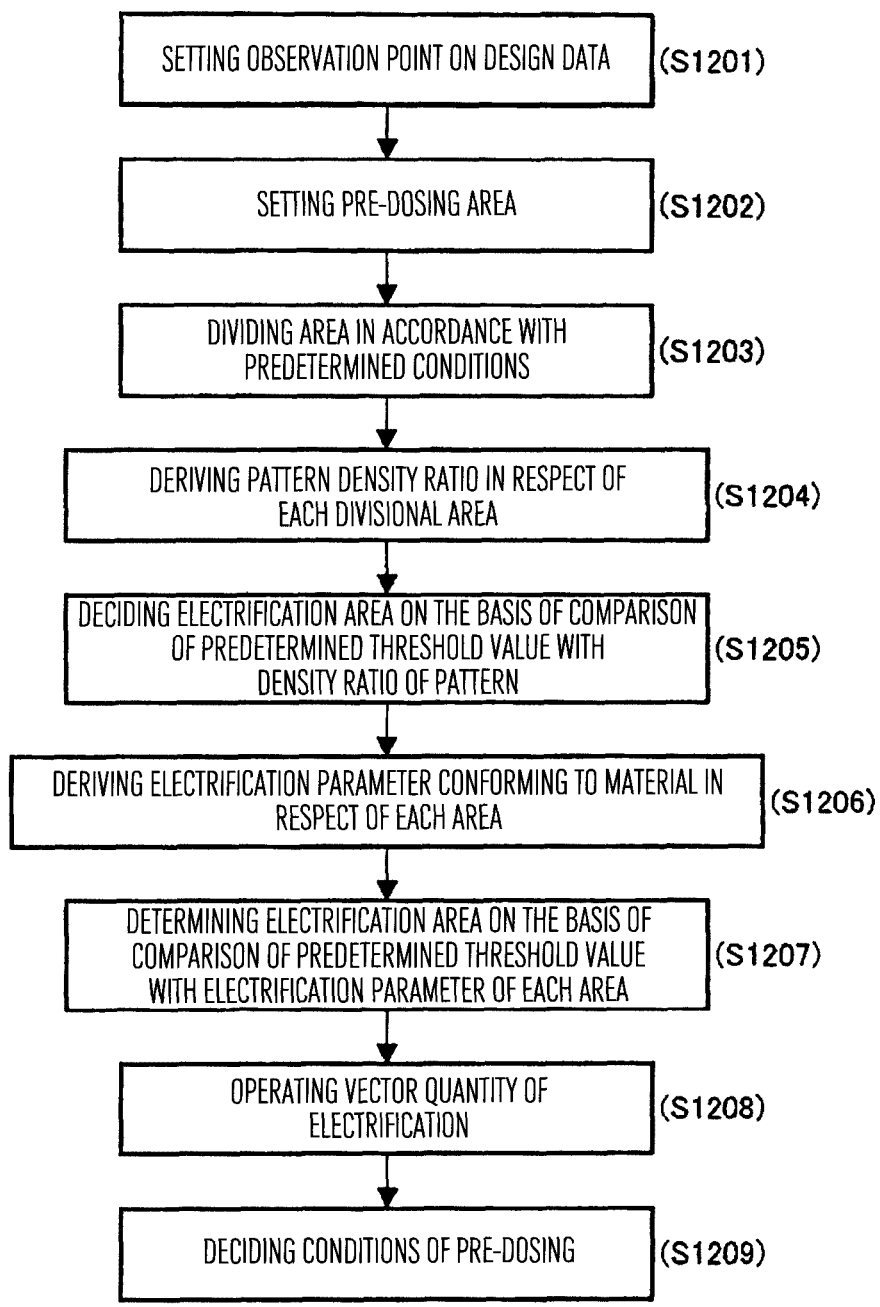
FIG. 12 is a flowchart for explaining processes of determining pre-dose conditions on the basis of setting of measurement points on the design data.

FIG. 11 is a diagram for explaining processes of determining conditions of pre-dosing on the basis setting of a measurement point 1102 (or a FOV for measurement) on the design data. FIG. 12 is a flowchart for explaining details of the processes. While, in the present embodiment, an explanation will be given of an example where the pre-dosing area 1101 is divided into 9 divisional areas and pre-dosing conditions are set in respect of the individual divisional areas, this is not limitative and a smaller or larger number of divisional areas may be set.

Firstly, the measurement point 1102 is set on the design data (step 1201). Then, a pre-dosing area 1101 is so set as to be centered on the measurement point 1102 (step 1202). The size of the pre-dosing area may be determined automatically on the basis of a relational expression which indicates the relation between the size of a FOV necessary for measurement and the size of the pre-dosing area or may be set to an arbitrary size.

Next, the pre-dosing area 1101 is divided in accordance with a predetermined condition (step 1203). In the present example, division is executed on the basis of such an initial condition that the pre-dosing area 1101 is divided into 9 divisional areas. In respect of the individual divisional areas 1103 as a result of such a division, preliminary irradiation conditions are determined on the basis of two conditions of a sample in the present example.

A first sample condition concerns a degree of denseness of patterns. An area in which easy to electrify patterns are arranged thick has an electrification amount larger than that of other areas. Further, a second condition concerns the kind of a material forming the pattern. An area in which an easy to electrify material is arranged has an electrification amount larger than that of other areas. On the basis of these sample conditions, setting is so executed that the electrification status of the whole of pre-dosing area 1101 can be uniform or can satisfy a predetermined condition, thereby ensuring that deflection of trajectories of the electron beam and of electrons given off from the hole bottom can be suppressed. To this end, in the present embodiment, a ratio of densities of patterns is determined among the individual divisional areas 1103 (step 1204). In a conceivable example of a density of each divisional area, a ratio of a square measure occupied by patterns to that of the divisional area (pattern occupation size or square measure/divisional area size or square measure) is determined. For example, when patterns occupy half of the divisional area, the occupation ratio can be said to be 50%.

By comparing the thus determined occupation ratio with the occupation ratio of divisional area 1108 in which the measurement point 1102 is contained, the density ratio of patterns in the divisional area is determined. In place of the comparison of occupation ratios, a density ratio may be calculated on the basis of comparison of absolute values of pattern sizes or square measures. Further, in place of the density ratio, a parameter is set which increases/decreases in proportion to an absolute value of the pattern size or square measure, and on the basis of the parameter, pre-dosing conditions to be described later may be set. In place of the ratio, magnitudes of the ratios are ranked and a rank may be used as a parameter substituting for the density ratio.

In the present embodiment, as an expression inclusive of the parameters or the like substituting for the ratio and density ratio, an expression termed an electrification parameter is used. The electrification parameter is an index indicative of easiness of electrification based on irradiation of the electron beam or the size or the easiness of changing of deposited electrification. Also, when patterns are thick locally or patterns are present in the right half only within the divisional area, the degree of influence the electrification has upon the measurement point is considered to change on the basis of a factor other than the size or square measure value and therefore, an electrification parameter also taking degrees of influence conforming to the contour of pattern into account may be set. In case the degree of deposition of electrification changes considerably in accordance with the contour of pattern, setting of electrification parameters conforming to pattern contours may also be considered.

Next, the electrification parameter based on the pattern density ratio determined in the step 1204 is compared with a predetermined threshold value to determine an electrification area (step 1205). A divisional area having an electrification parameter exceeding a predetermined value or in excess of a threshold value is an area considered to have its electrification amount rendered large. In other words, in comparison with other divisional areas, this area is an area which is deposited with electrification having the possibility of deflecting the trajectory of the electron beam and electrons discharged from the measuring point. FIG. 11 illustrates an example in which (A, a) and (C, b) in the pre-dosing area 1101 are each assumed to be such an area and a first electrification map 1104 is formed. A portion indicated by "α" is an area decided as an electrification area (for example, a divisional area 1105).

It will be appreciated that information indicative of the size or square measure of a pattern is extracted from design information of the design data stored in the data management unit 901 exemplified in FIG. 9 or in a different memory medium. Further, since a pattern formed through a semiconductor production process is considered as differing remarkably from the design data, light-exposure simulation is performed by means of the simulator 908 on the basis of the design data and then, the pattern size or square measure is determined on the basis of a pattern contour obtained through execution of the simulation.

Next, an electrification parameter complying with a sample material representing a second sample condition is derived (step 1206). Since the design data is registered with information concerning materials, materials of the individual divisional areas are specified by consulting the design data. For the relation between the material and the electrification parameter, a database is prepared in advance and by consulting the design data and the database, electrification parameters for the individual divisional areas are determined. To add, a plurality of materials will sometimes coexist in a single divisional area and in such a case, on the basis of ratios among the individual materials and electrification parameters of the individual materials, an electrification parameter for one divisional area may be determined. In case, even if a plurality of materials are composite but the influence of electrification deposited to one material is dominant and the influence of electrification of other materials can be negligible, an electrification parameter concerning the one material may be determined as an electrification parameter for the divisional area. In the present example, a ratio of easiness of electrification referenced to a divisional area 1108 (divisional area (B, b)) including the measurement point 1102 and having a reference (for example, 1.0) is set as an electrification parameter.

The electrification parameter as above may be stored in the design data such as a GDS file or the design data may be registered with only information concerning the pattern density and material and another database for storing the relation between the density and material and the electrification parameter of a pattern may be prepared so as to derive the electrification parameter by making reference to this database.

Next, by comparing the electrification parameter obtained in the step 1206 with the predetermined threshold value, an electrification area is determined (step 1207). A divisional area having an electrification parameter exceeding a predetermined value or in excess of a predetermined threshold value is an area considered to have its electrification amount rendered large. In other words, in comparison with other divisional areas, this area is an area which is considered to be deposited with electrification forming an electric field having the possibility of deflecting the trajectories of the electron beam and electrons discharged from the measurement point. FIG. 11 illustrates an example in which (A, a) and (B, c) in the pre-dosing area 1101 are each such an area and a second electrification map 1106 is formed. A portion indicated by "β" is an area decided as an electrification area (for example, a divisional area 1107).

Figure 13:
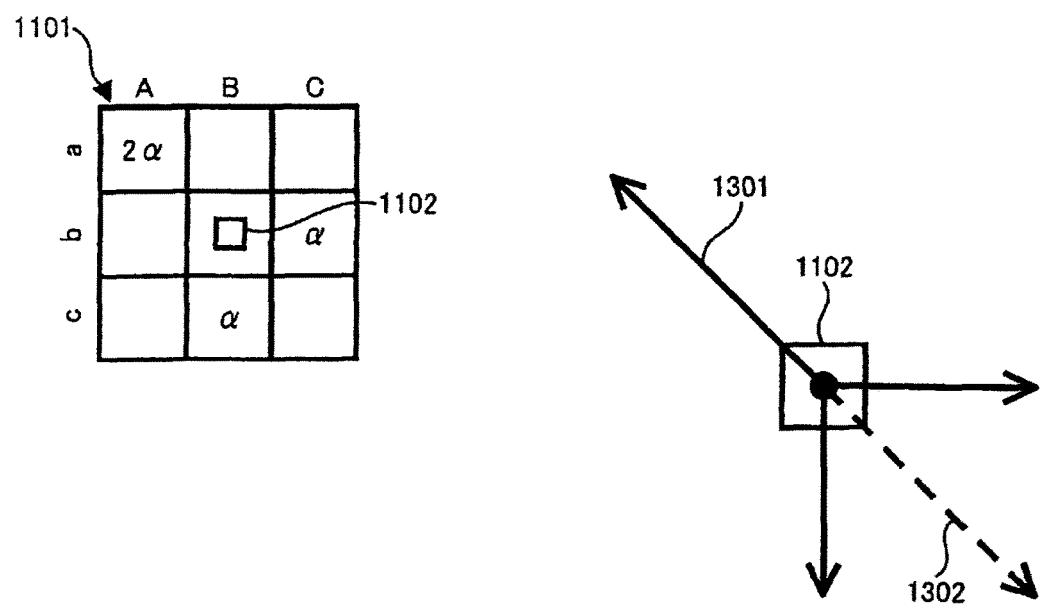
FIG. 13 is a diagram for explaining an example which gives expression to electrification deposited within the pre-dosing area by using vectors.

By making composite the electrification maps formed on the basis of two sample conditions as above, a third electrification map 1109 is obtained. Namely, the area (A, a) is an area decided to have large electrification deposited on the basis of the two sample conditions and each of the area (C, b) and area (B, c) is an area decided to have large electrification deposited on the basis of the one sample condition. If, for better understanding, the electrificationα and the electrificationβ are assumed to be of quite the same, the distribution of electrification as indicated by a fourth electrification map 1110 results. The electric field can be expressed by a vector field and therefore, a vector field referenced to the measurement point 1102 is indicated as shown in FIG. 13. Since, in the example of FIG. 13, a vector 1301 based on electrification (2a) deposited on the area (A, a) and the sum 1302 of vectors indicative of electrification deposited on the area (C, b) and the area (B, c) are mutually cancelled out, it will be seen that no deflection electric field exists for the measurement point 1102. By controlling the electrification amount of each divisional area on the basis of the vector operation referenced to the measurement point such that the vector becomes zero or approaches to zero, electrification can be formed on the sample surface without deflecting the electron beam and electrons given off from the sample to a direction orthogonal to the electron beam optical axis (ideal optical axis passing through the objective lens center). In the case of FIG. 13, no deflection field is caused even when different beam conditions are not set in respect of the individual divisional areas and therefore, such a pre-dosing operation as using the entire pre-dosing area 1101 as one scanning area is carried out.

Figure 14:
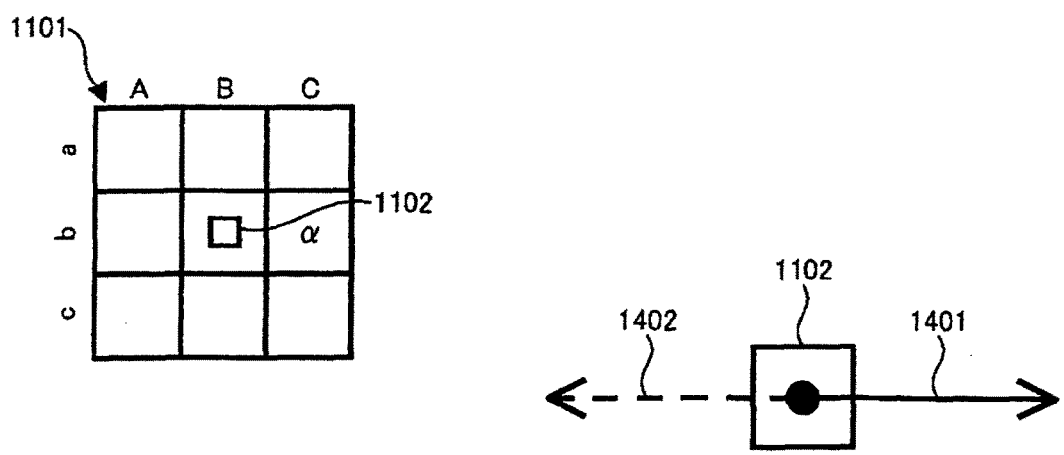
FIG. 14 is a diagram for explaining another example which gives expression to electrification deposited within the pre-dosing area by using vectors.

In the case of an example of FIG. 14, on the other hand, when the whole of pre-dosing area 1101 is scanned under the same condition, an electrification is biased to form a deflection electric field and so, another electrification for canceling out the deflection electric field is formed. For suppression of an influence the electrification has, two principally categorized methods can be considered. One of them is for causing the vector 1401 per se to disappear and the other is for forming a vector 1402 adapted to cancel out the vector 1401.

In the former method, the area (C, b) is scanned under a beam condition for suppressing the electrification. In order to suppress an influence the electrification has, that area must be scanned with a beam which does not cause another area to be electrified. Conceivably, the electrification can be suppressed by controlling the negative voltage applied to the sample so as to adjust landing energy of the electron beam. By using an electron beam having low landing energy of relatively low secondary electron discharge efficiency (amounts of electrons discharged from the sample/amounts of electrons incident to the sample), positive electrification can be suppressed. Since the secondary electron discharge efficiency in relation to the landing energy of the electron beam differs with the kind of sample, curves indicating individual changes in secondary electron discharge efficiency in relation to changes in landing energy are preferably obtained in advance in respect of kinds of sample and then, stored in a database. Further, the electrification can be changed by adjusting the magnification or beam current and accordingly, when the electrification of the area (C, b) is excessively high, the beam is scanned under the condition for suppressing electrification or the preliminary irradiation is not applied to the area (C, b).

In this manner, the difference in electrification parameter can be reduced between the divisional area including the measurement point 1102 and the other divisional areas and thus, the beam deflection based on the local electrification can be suppressed.

In the latter method, on the other hand, beam scanning is carried out for forming such an electric field (vector 1402) as canceling out deflection effects due to electrification deposited to the area (C, b). Specifically, it is conceivable to cancel out the deflection electric field by forming, in an area (A, b) opposing the area (C, b) around the center of, for example, the area (B, b) to which the measurement point 1102 belongs, the same electrification as that of the area (C, b). But, the area (A, b) is a portion which is decided as an area originally having smaller deposited electrification than that of the area (C, b) and therefore, there is also a possibility that necessary electrification cannot be obtained through adjustment of the beam condition. In such an event, beam scanning for forming the same electrification at the areas (A, a) and (A, c) may additionally be carried out to form an electrification which cancels out the vector 1401 or to form an electrification outside the pre-dosing area 1101.

As described above, by determining (step 1209) the pre-dosing conditions on the basis of the calculation of vector quantities of electrifications (step 1208), the pre-dosing can be carried out without generating the deflection electric field. Also, by describing in a table in advance the beam conditions and electrification parameters (for example, electrification amount, relative ratio of electrification to an area where the measurement portion exists, or the magnitude of vector and the like) in accordance with the kinds of sample such as represented by pattern density and material and by consulting the table, beam conditions for the individual areas may be derived. In respect of divisional areas other than the area (C, b) and the area in which the correction electric field is formed, the pre-dosing is executed in accordance with the initial irradiation conditions.

Figure 6:
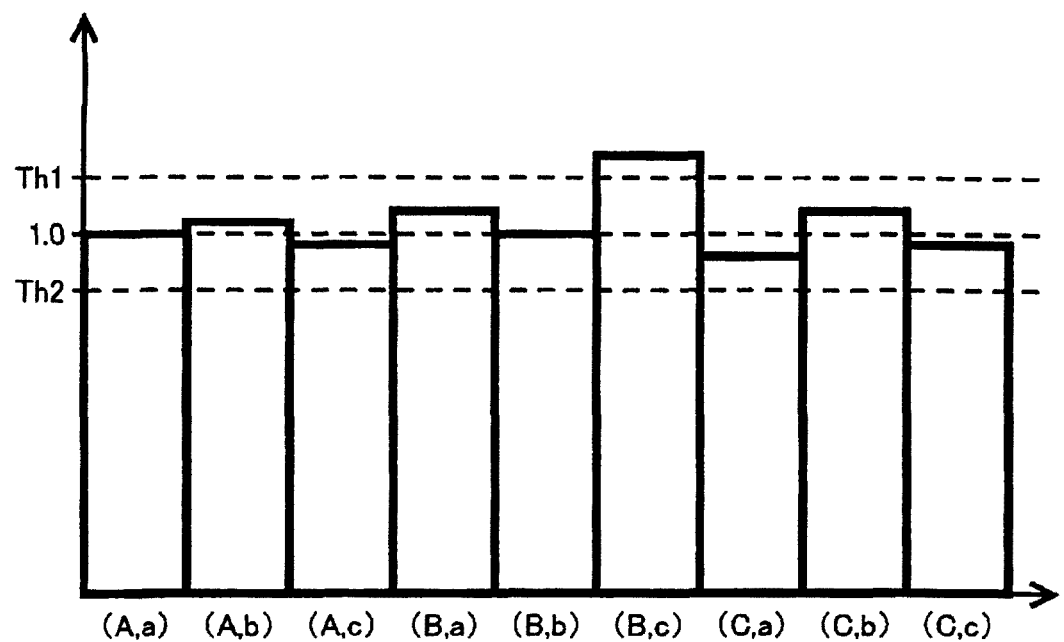
FIG. 6 is a graphic representation of the distribution of electrification amounts within the pre-dosing area.

Further, in respect of an area in which the displacement of electrification exceeds or in excess of a predetermined value when referenced to the electrification in the area (B, b) including the measurement point, the electrification amount may be controlled or the deflection electric field may be cancelled out. In FIG. 6, an example is explained in which electrification larger than that deposited to the area (B, b) is deposited to the area (B, c). By setting the beam conditions for the individual areas such that electrification amounts in the all of the divisional areas can be confined in a predetermined range without performing the vector operation as in FIG. 13, the deflection of the electron beam and electrons given off from the sample can be suppressed. In the present example, the beam conditions may be so set as to suppress the electrification amount in the area (B, b) or cancel out deflection action caused by the electrification in that area.

The present embodiment has been described by way of example of setting the pre-dosing conditions in respect of the individual divisional areas on the basis of the two sample conditions but when one of the sample conditions is dominant and an influence the other condition has upon the electrification can be negligible, a pre-dosing condition may be set on the basis of the one sample condition.

Further, the electrification will not halt at the same value but will attenuate gradually as the time elapses and so, evaluation of the electrification in consideration of the attenuation amounts may be considered. For example, when the pre-dosing area is divided into 9 areas as exemplified in FIG. 11 and pre-dosing is applied sequentially to the respective areas in order, the electrification is attenuated more largely in a divisional area in which the pre-dosing is effected first than in a divisional area in which the pre-dosing is effected last. Accordingly, the electrification parameter for the individual divisional areas may preferably be derived after adding values concerning attenuation amounts of electrification parameters complying with a time lapse from the pre-dosing to the measurement.

Figure 2:
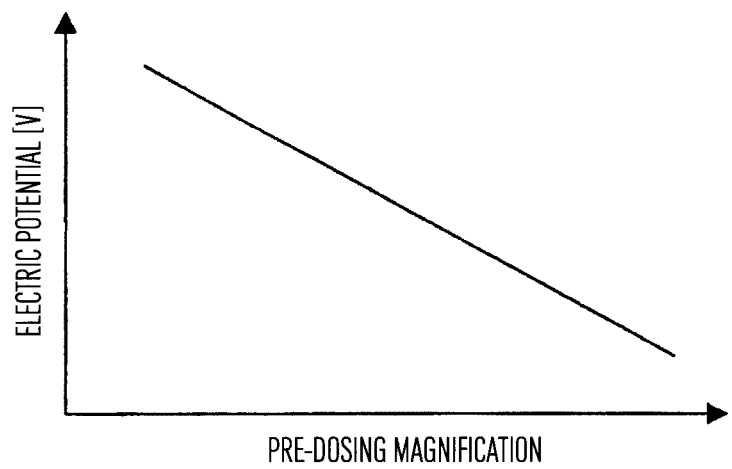
FIG. 2 is a diagram for explaining the relation between magnification and electrification electric potential.

FIG. 1 is a flowchart useful to explain processes for determining conditions of pre-dosing on the basis of inputting of an observation point (step 101) and inputting of electric potential of electrification to be deposited to the sample (step 102). In the example of FIG. 1, pattern information and material information of patterns included in a pre-dosing area are extracted from the design data and pre-dosing conditions are judged in respect of different patterns, spots of materials and area ratios. As input conditions, a spot where the sample is observed and electric potential necessary for observation are inputted. The pre-dosing magnification is related to the electric potential negatively as shown in FIG. 2 and it is known that the lower the pre-dosing magnification, the higher the obtainable electric potential becomes though values differ depending on materials. Since the pre-dosing magnifications and the gradients of electric potential to be formed differ depending on the surface material, a gradient for the observation material is evaluated in advance and information concerning the gradient is stored in a predetermined memory medium.

Next, pattern information included in the pre-dosing area is extracted from the design data (step 103). Here, the observation point is set as being center and a predetermined size of range centered on the observation point is extracted as a pre-dosing area. In respect of the extracted pre-dosing area, it is decided whether a pattern or material different from that of the observation area exists. When it is determined in step 104 that a different pattern is included, a judgment flag 1 is set as 0→1 and when it is determined in step 105 that a different material is included, a judgment flag 2 is set as 0→1.

When it is determined in step 106 that neither of them is contained, both the judgment flags 1 and 2 are set to 0 to exhibit uniformity of materials and contours within the pre-dosing range, so that it is determined that electrification change after the pre-dosing is also uniform and the ordinary pre-dosing is conducted (step 108). On the other hand, when it is determined that either of them is included, the program proceeds to judgment of spots where the electrification changes differently and pre-dosing conditions to be superposed are obtained (step 109).

Figure 3:
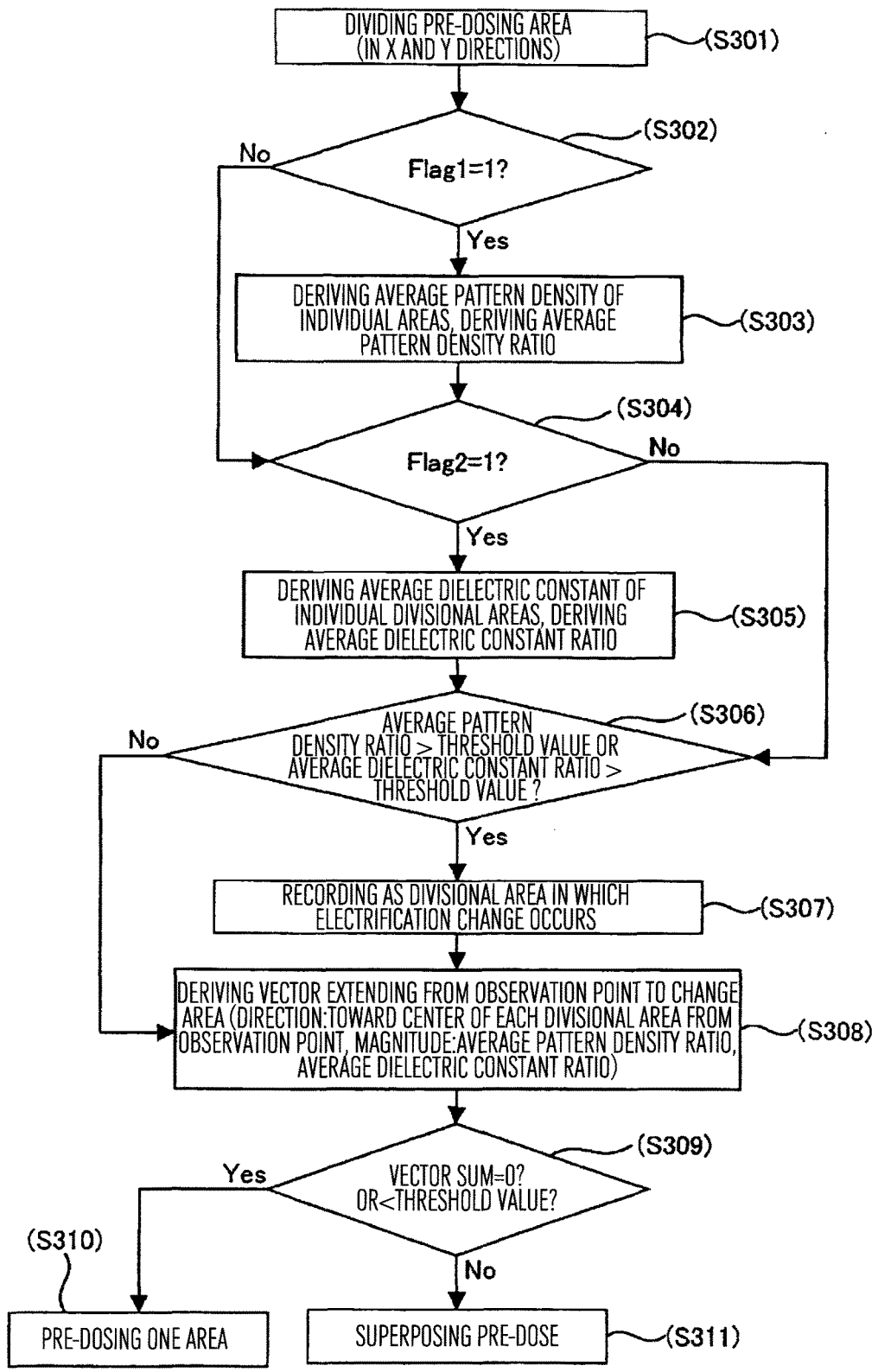
FIG. 3 is a flowchart for explaining processes of determining pre-dosing conditions on the basis of division of a pre-dosing area.

In step 107, the condition of distribution of electrifications inside the pre-dosing area is judged. Namely, in view of the fact that the electrification deposit conditions inside the pre-dosing area are not uniform but change with sites, conditions of electrifications at the respective positions are judged. FIG. 3 is a flowchart for explaining processes for the judgment. Firstly, a pre-dosing area is divided into n×m divisional areas designated by the user in X and Y directions (step 301). When the judgment flag 1 is set to 1, an average pattern density of the individual divisional areas is obtained and a ratio of the pattern density to that of an area including an observation point is derived (step 302).

To derive the average pattern density in step 303, patterns included in the divisional areas are first extracted and a surface size or square measure of all patterns included in the divisional areas is obtained. The obtained surface square measure is divided by a square measure of the divisional area to get a value which in turn defines an average pattern density. The pattern density is a value which differs with contours and in the case of observation of HARC, even for the same material, the electrification changes differently in accordance with a pattern density such as pitch size. It is known that in the HARC, the smaller the pitch of pattern, and the larger the change of electrification becomes. Here, the larger the surface square measure, the larger the average pattern density becomes, indicating that the electrification changes largely.

Subsequently, when the judgment flag 2 is set to 1, indicating that different kinds of materials are included, average dielectric constants of the individual divisional areas are determined to derive a ratio of dielectric constant of each divisional area to that of the observation area (step 304). In step 305, in connection with the average dielectric constant, different kinds of materials contained in the area are extracted. The dielectric constant is a value inherent to a material and in accordance with square measures of individual materials and the individual dielectric constants are averaged. By using the average pattern density ratio and the average dielectric constant ratio derived in respect of the individual divisional areas as above, judgment as below is carried out. When the obtained average pattern density ratio and average dielectric constant ratio are larger than the threshold values designated by the user, the area is considered as having a possibility of undergoing electrification change and is stored in the memory of data processing PC or in a predetermined memory medium such as HDD (step 307). The threshold value must be determined by measuring samples of different pitch sizes (in the present embodiment, the threshold value was set by evaluating a HARC sample ($SiO_2$/Si) having an aspect of 20) through pre-evaluation.

An example in which a plurality of divisional areas subject to different electrification changes exist inside a pre-dosing area is illustrated in FIG. 4. The pre-dosing area exemplified in FIG. 4 is divided into nine (3×3) divisional areas. A hatched area indicates a divisional area having an electrification change ratio in excess of the threshold value (hereinafter referred to as an electrification change area) and the electrification change areas have constant electrification change ratios, respectively. A point indicated by a circle in an area (B, b) is a measurement point. At that time, if the change rates are symmetrical to an observation area on the diagonal line, curving of the electron beam due to the electrification change can be cancelled, giving rise to no problem and so the ordinary pre-dosing is carried out at (a) and (b) in FIG. 4. On the other hand, at (c), (d) and (e), the symmetry of electrification changes in the pre-dosing area does not stand and when the ordinary pre-dosing for a single area is conducted, the electron beam is caused to curve.

In order to judge the symmetry of electrification change areas included in the pre-dosing area to the observation point, as described above, a vector from the observation point to the electrification change area is derived in the present embodiment (step 308). The vector is directed to the center of each divisional area from the observation point and its magnitude corresponds to the average pattern density ratio or dielectric constant ratio. Next, in connection with the individual divisional areas in the pre-dosing area, the sum of vectors is obtained (step 309). If the value is 0 or less than the threshold value designated by the user, changes in electrification as shown at (a) and (b) in FIG. 4 take place but the changes are symmetrical to the observation point and such an influence upon the electron beam as a drift can be considered as being cancelled, permitting the ordinary pre-dosing to be conducted (step 310). On the other hand, when the prescribed conditions are not satisfied in the step 309, the pre-dosing using a plurality of beam irradiation conditions in combination is executed (step 311).

As described above, when the electrification change rate in the divisional area is larger than the threshold value and the symmetry does not stand in the pre-dosing area, a pre-dosing condition excluding the electrification change area is set.

The above description is given of an example where a single observation point exists on the sample but the above is applicable to an instance where observation points dispersed to a plurality of areas are observed by using image shift. In the observation using the image shift, the drift amount will sometimes differ depending on observation spots.

This is because the electric potential distribution inside the pre-dosing area disperses. Accordingly, in the observation using the image shift, the drift amount differs with spots and a point desired to be observed cannot sometime be observed.

Electrification change areas surrounding individual points to be observed by using the image shift are judged as to whether to be symmetrical to one another. When the change rate in a surrounding area is not symmetrical to the observation point, pre-dosing is executed after excluding the area having the different change rate.

A manner for executing the pre-dosing by excluding the electrification change area is exemplified in FIG. 5. Scanning may be conducted in respect of individual divisional areas as exemplified at (a) in FIG. 5 or may be conducted collectively in respect of areas for which the pre-dosing is conducted under the same beam condition, as exemplified at (b) in FIG. 5. An area surrounded with dotted line in FIG. 5 shows an area for which the pre-dosing is conducted selectively. The other portions, on the other hand, indicate areas to which pre-dosing is not so applied as to suppress non-uniformity of electrification. Shown at (b) in FIG. 5 is an example where six divisional areas are collected to three composite divisional areas and scanning is applied collectively to each of the composite divisional areas. As shown at (c) in FIG. 5, pre-dosing areas are scanned collectively and the excluding areas are not scanned selectively with an electron beam by blanking the electron beam.

In the example of FIG. 5, areas other than those surrounded with dotted line are electrification change areas. In the method of combining the scanning conditions for one divisional area size as exemplified at (a) in FIG. 5, the pre-dosing is carried out by scanning the individual divisional areas separately. In the method of setting a scanning area by combining two divisional areas as exemplified at (b) in FIG. 5, the number of superposing pre-dose operations can be reduced when the electrification change areas are thick or dense, thereby making it possible to improve the throughput. Also, in the method of pre-dosing as exemplified at (c) in FIG. 5 in which the electron beam irradiation need not be operated by the number of times corresponding to the number of designated arrears, the pre-dosing can be executed by one scanning when conditions (areas) are designated in advance.

According to any of the above methods, the pre-dosing can be conducted by excluding the electrification change area and an influence a change in electrification formed by the pre-dosing has can be suppressed. Further, in the observation using the image shift, observation of a plurality of points which uses the image shift can be carried out through one pre-dosing and improvements in throughput can be expected.

Even for the same average pattern density and average dielectric constant on the sample, the secondary electron yield will sometimes differ when the material differs. Different secondary electron yield is responsible for causing the landing electric potential to differ and the landing time to change through pre-dosing. For example, it has been known that the higher the yield, the shorter the time the pre-dosing consumes until the maximum (saturated) electric potential reaches becomes.

Figure 7:
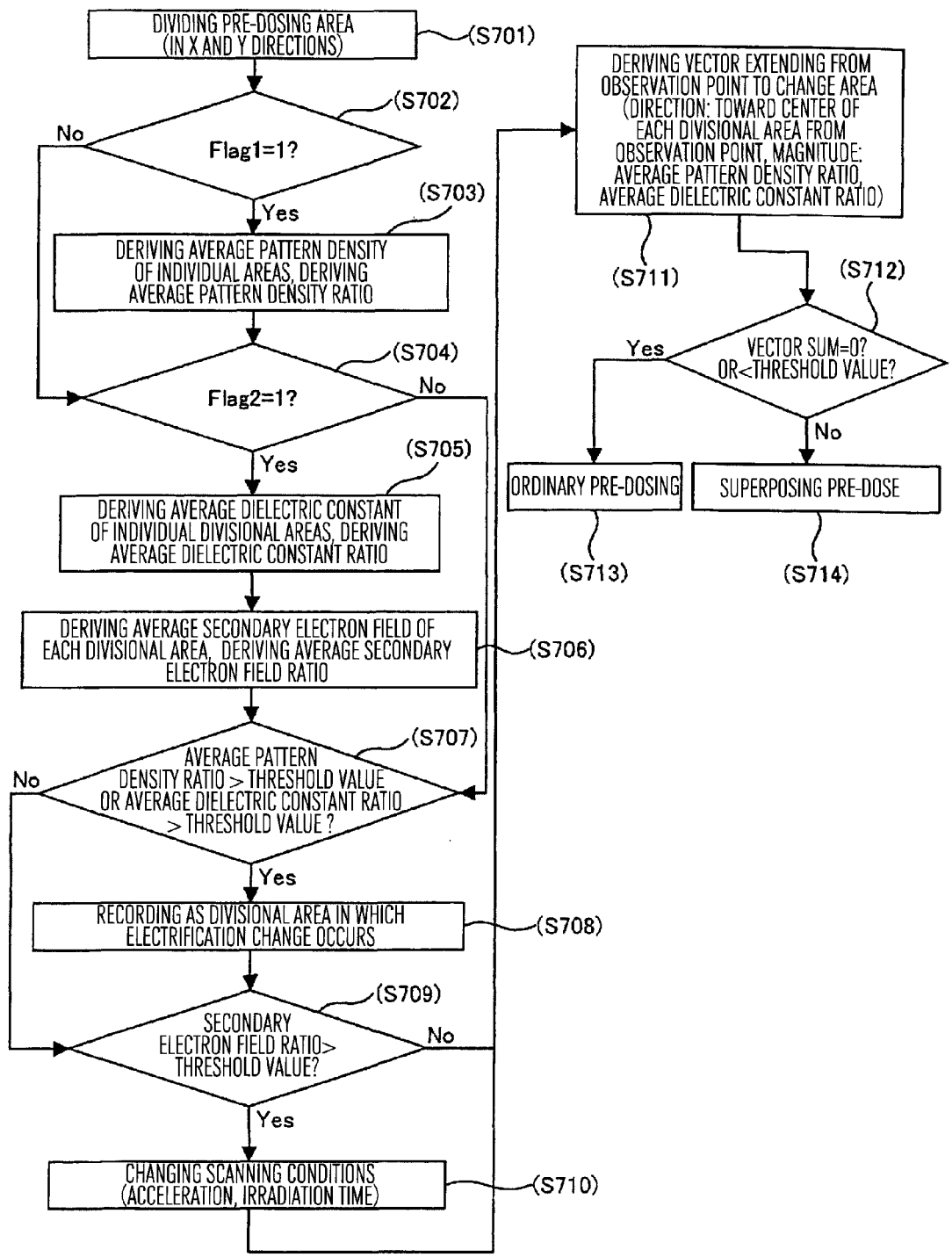
FIG. 7 is a flowchart for explaining processes of determining pre-dosing conditions in consideration of the yield of secondary electrons.

FIG. 7 is a flowchart useful to explain processes for determining pre-dosing conditions considering the yield of secondary electrons. Steps 701 to 705 correspond to the steps 301 to 305 in FIG. 3. Also, step 707 and steps 711 to 714 correspond to the step 305 and the steps 308 to 311. In the flowchart of FIG. 7, steps 706, 709 and 710 are added newly.

When it is determined on the basis of the design data that a different kind of material is included in a pre-dosing area, an average of secondary electron yields of individual divisional areas is obtained in step 706 and a ratio of the average secondary electron yield to the secondary electron yield at the observation point is derived. When areas having different secondary electron yields are included in the pre-dosing area and the pre-dosing is carried out divisional area by divisional area, the scanning condition is changed every divisional area. Here, acceleration and irradiation time of the primary electrons are changed.

When the yield ratio is decided as being larger than the threshold value in step 709, thus indicating earlier arrival at saturation electric potential, the irradiation time is shortened for the sake of improving the throughput. On the other hand, when the yield ratio is smaller than the threshold value, the irradiation time is set as being long or when the yield is increased by changing acceleration of the primary electrons, the acceleration is changed (step 710).

As described above, by changing any one of the irradiation time and primary electron acceleration or both of them, uniform electric potential is formed. In this case, by measuring saturation electric potential and time to reach the saturation electric potential of each material in advance and storing them in the memory medium, setting of conditions of pre-dosing can be possible.

Figure 8:
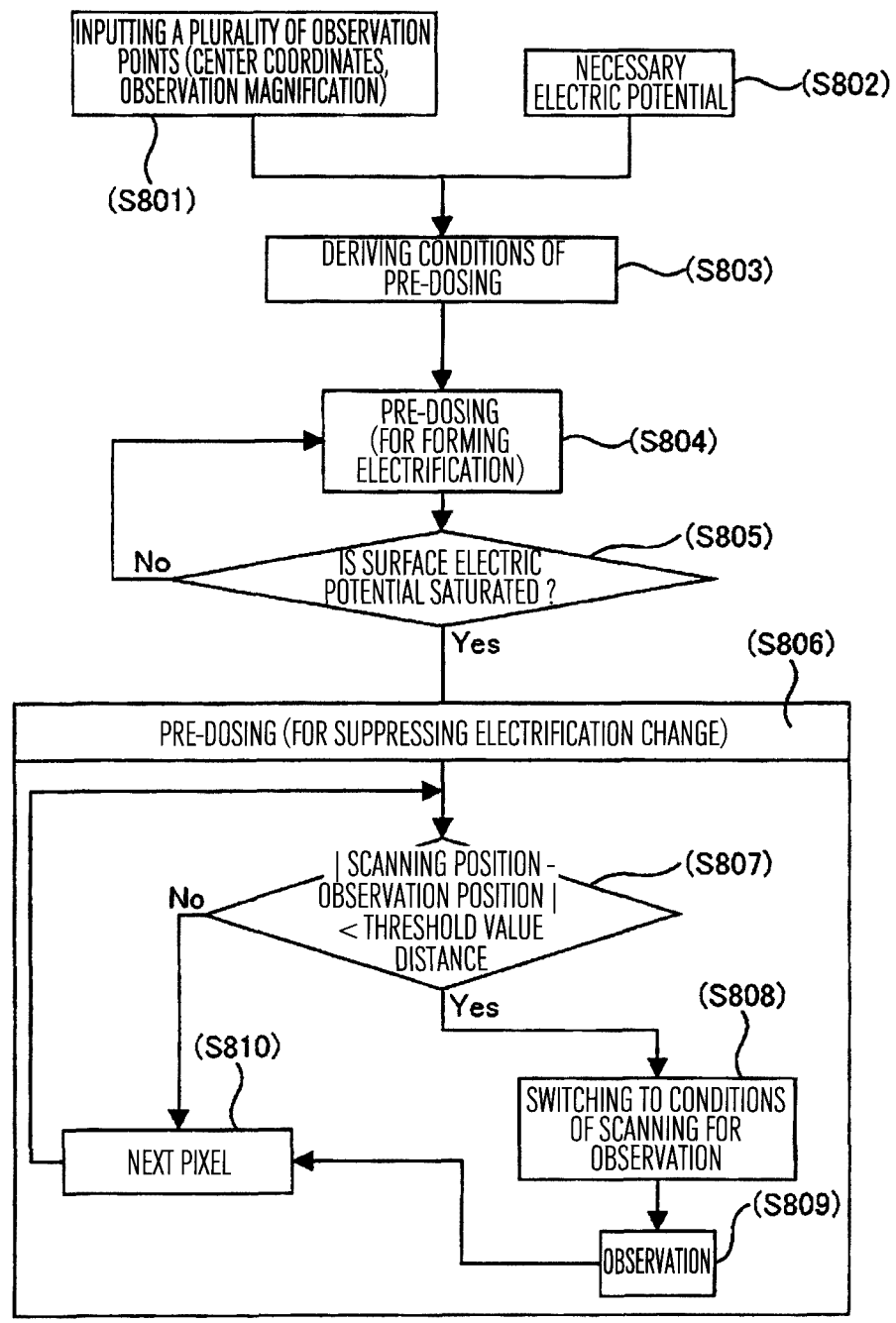
FIG. 8 is a flowchart for explaining processes ranging from process of setting conditions of execution of beam irradiation for electrification formation and beam irradiation for observation as well, to process of observation.

FIG. 8 is a flowchart useful to explain processes ranging from setting of conditions of performing beam irradiation for electrification formation and observation as well to process of observing. The pre-dose literally means a method for performing deposition of electrification to a sample by preliminary irradiation in advance of observation but, since the preliminary electrification formation and observation are carried out at different timings, a time difference between the electrification formation and the observation causes the electrification condition to change and possibly, desired conditions of pre-dosing cannot be obtained. There is also a possibility that an image drift will occur by a change in electrification condition. In the present example, a method for performing the pre-dosing along with observation will therefore be described. In the present embodiment, after forming positive electrification, the scanning condition is switched on the way of a frame of pre-dosing so as to conduct observation. In the flowchart exemplified in FIG. 8, center coordinates of an observation point and an observation magnification are first inputted as conditions of measurement using the scanning electron microscope (step 801). Also, positive electrification electric potential necessary for observation is set (step 802). Like the flowchart exemplified in FIG. 1, conditions of pre-dosing necessary for positive electrification are determined on the basis of the relation between preliminary electrification magnification and electrification electric potential exemplified in FIG. 2 (step 803) and the pre-dosing is carried out (step 804). After the surface electric potential has been saturated through the pre-dosing, the program proceeds to the next step (step 805). During scanning for pre-dosing (step 805), the distance between a beam scanning position and an observation position is monitored (step 807) and when the distance between a scanning point and an observation point falls below the threshold value at a time point, the scanning condition is switched (step 808) and observation is carried out (step 809). The threshold distance referred to herein is defined as one pixel in pre-dose scanning. After completion of observation, switching is again conducted to the pre-dose scanning condition and the pre-dosing continues (step 810).

REFERENCE SIGNS LIST

901 Data management unit
902, 903 SEM
904, 905 Control unit
906, 907 Communication line
908 Simulator
1001 Electron source
1002 Extraction electrode
1003 Electron beam
1004 Condenser lens
1005 Scanning deflector
1006 Objective lens
1007 Sample chamber
1008 Sample stage
1009 Sample
1010 Electrons
1011 Secondary electrons
1012 Conversion electrode
1013 Detector

The invention claimed is:

1. An electron beam irradiation method for scanning a first electron beam on a sample to electrify the sample and for measuring or inspecting the sample based on electrons obtained by scanning a second electron beam on the electrified sample,
   wherein a scanning area of the second electron beam includes a plurality of divisional areas, and each irradiation condition of the first electron beam for each of the plurality of divisional areas is selected so that, when the first electron beam is irradiated to the divisional areas, although electrification generated in each of the divisional areas varies, differences in electrification among the divisional areas are canceled out so that electrification generated in the scanning area is symmetrical with respect to a center of the scanning area.

2. The electron beam irradiation method according to claim 1, wherein each electrification parameter indicative of degrees of the electrification generated in the divisional areas is derived based on at least one of a density of a pattern inside a respective divisional area and a parameter allotted in compliance with a material of the pattern inside the respective divisional area.

3. The electron beam irradiation method according to claim 1, wherein the first electron beam is scanned with different beam irradiation conditions for a first divisional area and a second divisional area.

4. The electron beam irradiation method according to claim 1, wherein conditions of scanning for the plurality of divisional areas are determined such that dispersions in electrification distribution in the scanning area of the second electron beam are suppressed or cancelled out.

5. The electron beam irradiation method according to claim 1, wherein each electrification parameter is derived based on design data of the sample.

6. A scanning electron microscope comprising:
   an electron source;
   a lens for converging an electron beam emitted from the electron source;
   a scanning deflector for scanning the electron beam on a sample; and
   a detector for detecting electrons given off from the sample,
   wherein the scanning electron microscope further comprises a control unit which incorporates a memory medium adapted to store beam conditions of a first electron beam for electrifying the sample and beam conditions of a second electron beam for measuring or inspecting the sample, or which can access the memory medium,
   wherein the control unit is configured to divide a scanning area of the second electron beam into a plurality of divisional areas, and to select each irradiation condition of the first electron beam for each of the plurality of divisional areas so that, when the first electron beam is irradiated to the divisional areas, although electrification generated in each of the divisional areas varies, differences in electrification among the divisional areas are canceled out so that electrification generated in the scanning area is symmetrical with respect to a center of the scanning area.

7. The scanning electron microscope according to claim 6, wherein the control unit derives each electrification parameter based on at least one of a density of a pattern inside a respective divisional area and a parameter allotted in compliance with a material of the pattern inside the respective divisional area.

8. The scanning electron microscope according to claim 6, wherein the control unit derives, by scanning the electron beam under different beam conditions to the plurality of divisional areas, a condition for minimizing the difference between the electrification parameters of a first divisional area and a second divisional area.

9. The scanning electron microscope according to claim 6, wherein the control unit sets conditions of scanning for the plurality of divisional areas such that dispersions in electrification distribution in the second electron beam scan area are suppressed or cancelled out.

10. The scanning electron microscope according to claim 6, wherein the control unit derives each electrification parameter based on design data of the sample.

* * * * *